US012781336B2

(12) United States Patent
Kuratomi et al.

(10) Patent No.: US 12,781,336 B2
(45) Date of Patent: Nov. 3, 2026

(54) SUBSTRATE CARRIER TO CONTROL TEMPERATURE OF SUBSTRATE

(71) Applicant: Applied Materials, Inc., Santa Clara, CA (US)

(72) Inventors: Takashi Kuratomi, San Jose, CA (US); Ki-Pyo Hong, East Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 679 days.

(21) Appl. No.: 18/104,437

(22) Filed: Feb. 1, 2023

(65) Prior Publication Data

US 2023/0265554 A1 Aug. 24, 2023

Related U.S. Application Data

(60) Provisional application No. 63/311,831, filed on Feb. 18, 2022.

(51) Int. Cl.
*C23C 16/458* (2006.01)
*B25B 5/16* (2006.01)
(Continued)

(52) U.S. Cl.
CPC .............. *C23C 14/50* (2013.01); *B25B 5/163* (2013.01); *C23C 14/34* (2013.01)

(58) Field of Classification Search
CPC ............. H01L 21/68721; H01L 21/683; C23C 16/4585; C23C 14/50; C23C 16/4586;
(Continued)

(56) References Cited

U.S. PATENT DOCUMENTS 5,262,029 A * 11/1993 Erskine ............. H01L 21/68735 118/503
5,326,725 A * 7/1994 Sherstinsky .......... C23C 16/042 118/503
(Continued)

FOREIGN PATENT DOCUMENTS

JP 2010-098011 A 4/2010
KR 10-1366441 B1 2/2014
KR 10-2017-0127688 A 11/2017

OTHER PUBLICATIONS

Document ID: JP H0345634 U; Date Published: Apr. 26, 1991 (Year: 1991).*
(Continued)

*Primary Examiner* — Mahdi H Nejad
(74) *Attorney, Agent, or Firm* — Patterson + Sheridan, LLP

(57) ABSTRACT

An apparatus for processing a semiconductor substrate, such as an optical device, is described herein. The apparatus includes a substrate carrier which is configured to enable a processing chamber configured to process larger substrates to process a smaller substrate without retrofitting the processing chamber. The substrate carrier includes a carrier base and a clamp ring. The carrier base includes a plurality of gas channels formed within a substrate pocket. The clamp ring is disposed on the carrier base and over the substrate and holds the substrate in place. The clamp ring is either weighted or configured to be held by a separate chamber clamping mechanism.

20 Claims, 11 Drawing Sheets

(51) Int. Cl.
*C23C 14/34* (2006.01)
*C23C 14/50* (2006.01)
*H10P 72/76* (2026.01)

(58) Field of Classification Search
CPC ............. C23C 16/4412; H10P 72/7606; H10P 72/7611; H10P 50/242; H10P 72/7624; H10P 72/70; H01J 37/32715
See application file for complete search history.

(56) References Cited

U.S. PATENT DOCUMENTS

2001/0042514 A1* 11/2001 Mizuno ................... C23C 16/54 118/728
2003/0217693 A1* 11/2003 Rattner ............. H01L 21/68785 118/500
2006/0272561 A1* 12/2006 Chang ................. H10P 72/7611 111/183
2014/0130743 A1* 5/2014 Toriya ............... C23C 16/45565 118/725
2017/0121847 A1 5/2017 Armour et al.
2021/0162562 A1* 6/2021 Kim .................... H10P 72/7621
2021/0287996 A1* 9/2021 Zeng .................. H10D 62/8503
2025/0054803 A1* 2/2025 Lee ................... H01L 21/68742

OTHER PUBLICATIONS

Vacuum Processing Equipment Using a Transport Tray; Patent No. 4990636; Document ID: JP 4990636 B2; Date Published: Aug. 1, 2012; Application No. JP 2007003402 A; Date Filed: Jan. 11, 2007 (Year: 2007).*

Semi-Batch Type Atomic Layer Deposition Apparatus Having Clamp Ring; Patent No. 20120048879; Document ID: KR 20120048879 A; Date Published: May 16, 2012; Inventor: Kang Hyun, Kang Seung Ik (Year: 2012).*

International Search Report and Written Opinion dated May 26, 2023 for International Application No. PCT/US2023/012070.

* cited by examiner

SUBSTRATE CARRIER TO CONTROL TEMPERATURE OF SUBSTRATE

CROSS-REFERENCE TO RELATED APPLICATIONS

This application claims the benefit of U.S. Provisional Patent Application Ser. No. 63/311,831, filed Feb. 18, 2022, which is incorporated by reference herein in its entirety.

BACKGROUND

Field

Embodiments of the present disclosure generally relate to a carrier for transferring a carrier for transferring substrates of varying sizes between semiconductor processing chambers.

Description of the Related Art

Semiconductor processing chambers, such as deposition, etching, or annealing chambers are configured to process substrates of one particular size. In many instances, processing chambers are configured to process either a 300 mm substrate or a 200 mm substrate. However, in some applications, smaller substrates are utilized than the processing chamber is configured to process. In these instances, a processing chamber originally configured to process a 300 mm substrate would process a 200 mm, a 150 mm, or a 100 mm substrate. In another embodiment, a processing chamber originally configured to process a 200 mm substrate would process a 150 mm or a 100 mm substrate.

When smaller substrates than the processing chambers are originally configured to handle are being treated, the original transfer devices and chamber clamping mechanisms are not always compatible with the smaller substrate. However, replacing transfer devices and/or chamber clamping mechanisms within processing chambers is expensive, requires extensive downtime, and prevents quick changes between substrate sizes being processed.

Reduced substrate sizes are often utilized when manufacturing optical devices, such as waveguides, flat optical devices, metasurfaces, color-filters, and anti-reflective coatings. Optical devices are engineered to exhibit a high refractive index and low absorption loss properties. During optical device formation, temperature control and scratch reduction assist in improving optical device performance.

Substrate carriers are utilized which mimic the size and shape of a larger substrate, which the processing chambers are configured to process, while a smaller substrate is being processed. Substrate carriers are similar in composition to a substrate and hold the substrate as the substrate passes between different processing chambers and transfer chambers. However, substrate carriers are limited in ability and control of heating and cooling of substrates positioned therein and substrates often shift during transfer. Limited heating/cooling control sometimes causes over or under processing of a substrate, or substrate shifting. Substrate shifting may lead to uneven processing or scratches on the substrate itself.

Therefore, there is a need to improve substrate heating/cooling and reduce substrate shift while utilizing substrate carriers.

SUMMARY

The present disclosure generally relates to substrate carriers, configured for use during semiconductor processing.

In one embodiment, the substrate carrier includes a carrier base and a clamp ring. The carrier base includes an outer base surface, a lower base surface disposed radially inward of the outer base surface, an upper base surface disposed radially inward of the outer base surface and opposite the lower base surface, a substrate pocket disposed from the upper base surface and towards the lower base surface, a plurality of gas channels formed between the lower base surface and the substrate pocket, and one or more base alignment features formed on the upper base surface. The clamp ring is disposed on the upper base surface. The clamp ring includes an outer clamp surface, a lower clamp surface disposed radially inward of the outer clamp surface, an upper clamp surface disposed radially inward of the outer clamp surface and opposite the lower clamp surface, and an inner clamp surface radially inward of the outer clamp surface and connecting the lower clamp surface and the upper clamp surface. The inner clamp surface extends radially inward over the substrate pocket.

In another embodiment, another substrate carrier is described. The substrate carrier includes a carrier base and a clamp ring. The carrier base includes an outer base surface, a lower base surface, an upper base surface opposite the lower base surface, a substrate pocket disposed from the upper base surface and towards the lower base surface, one or more substrate support features extending from the substrate pocket, a plurality of gas channels formed between the lower base surface and the substrate pocket, and one or more base alignment features formed on the upper base surface. The clamp ring is disposed on the upper base surface. The clamp ring includes an outer clamp surface extending in line with or radially outward from the outer base surface, a lower clamp surface, an upper clamp surface opposite the lower clamp surface, an inner clamp surface radially inward of the outer clamp surface and extending radially inward over the substrate pocket, and one or more clamp ring alignment features on the lower clamp surface.

In yet another embodiment, a substrate carrier is described which includes a carrier base. The carrier base includes an outer base surface having a diameter of about 300 mm to about 325 mm, a lower base surface radially inward of the outer base surface, an upper base surface opposite the lower base surface and radially inward of the outer base surface, a substrate pocket disposed from the upper base surface and towards the lower base surface, a substrate support ring extending from the substrate pocket, and a plurality of gas channels formed between the lower base surface and the substrate pocket and disposed radially inward of the substrate support ring. The plurality of gas channels include over 100 gas channels with each gas channel having a diameter of about 10 mils to about 75 mils. One or more base alignment features are formed on the upper base surface.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1:
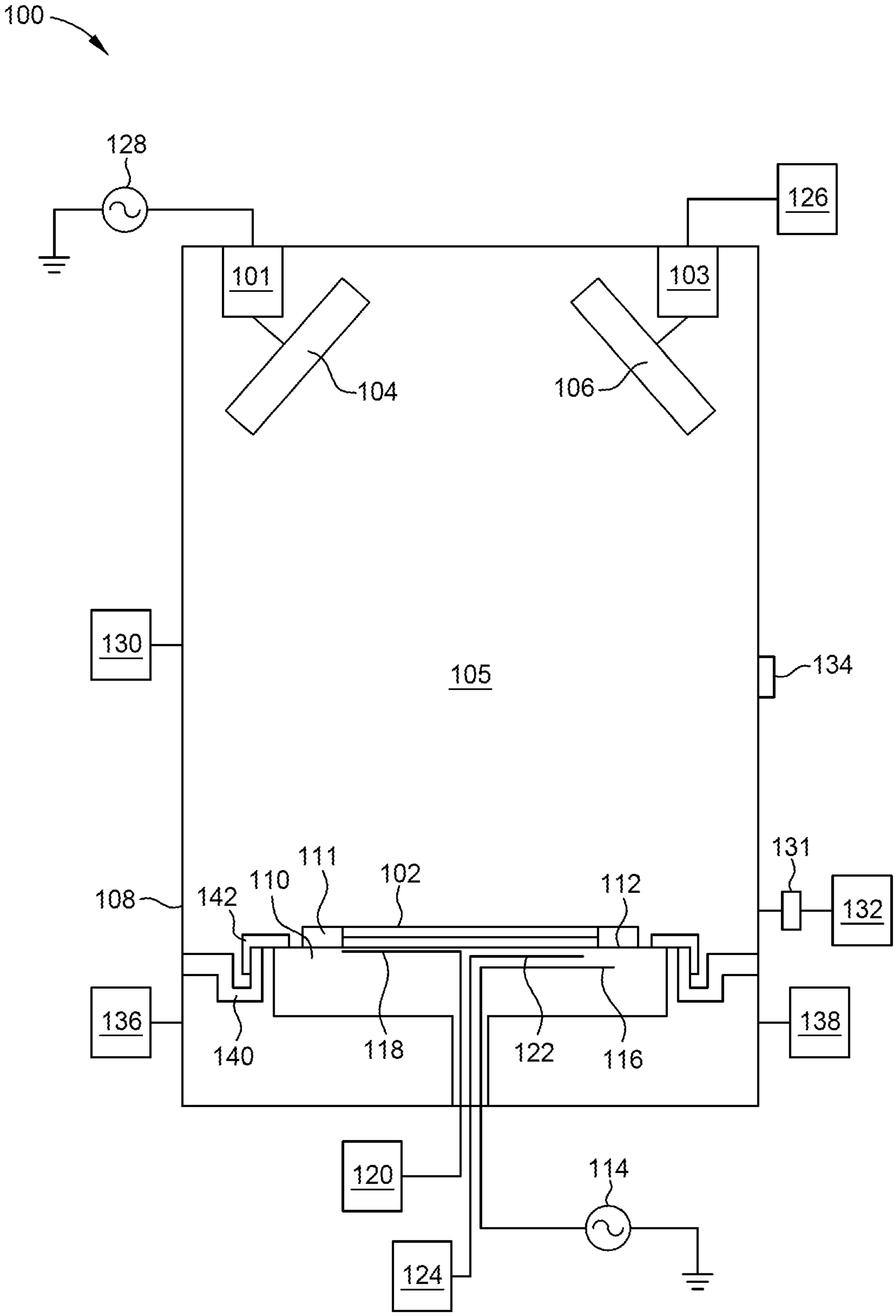
FIG. 1 is a schematic cross sectional view of a physical vapor deposition (PVD) process chamber, according to embodiments described herein.

The present disclosure is directed towards a substrate carrier with improved temperature control and reduced sliding. To run small substrate sizes in a system configured for larger substrate (e.g., wafer) sizes, substrate carriers similar to those described herein are utilized. The substrate carrier is used to transfer and process smaller sized substrates. However, previous substrate carriers have poor substrate temperature control. Poor substrate temperature control degrades process performance.

The substrate carrier described herein enables improved substrate temperature control by enabling backside gas flow on the back of the substrate. Flowing backside gas on the back of the substrate enhances thermal conductivity and control of the substrate temperature, such that the temperature of the substrate is closer to the temperature of a heater or pedestal. Backside gas flow therefore improves process performance for a variety of substrate processing operations, such as deposition processes, etching processes, and annealing processes. Deposition processes include atomic layer deposition (ALD), chemical vapor deposition (CVD), and physical vapor deposition (PVD). Etching processes include dry etching processes such as reactive ion etching (RIE). Annealing processes include rapid thermal processing (RTP) or furnace processing. Other processes which utilize substrate temperature control to improve processing results may also benefit from the substrate carrier as described herein. The embodiments described herein are particularly beneficial during PVD operations as the carrier is configured to enable improved heating/cooling control while still enabling a uniform electric field to pass through the substrate between an electrode within a pedestal on which the carrier is positioned and an electrode formed as part of a magnetron assembly.

In particular, the substrate carrier described herein is beneficial during deposition processes such as amorphous niobium oxide ($\alpha$-$NbO_x$) deposition or high refractive index Titanium oxide ($TiO_x$) deposition. $\alpha$-$NbO_x$ and $TiO_x$ deposition benefit from increased process control. During $\alpha$-$NbO_x$ deposition, it is desired to have low film loss with improved amorphization. Forming the $\alpha$-$NbO_x$ layer includes applying a direct current (DC) power and electric field across the substrate while flowing a process gas, such as a purge gas, as a backside gas and within the process chamber. $\alpha$-$NbO_x$ deposition is cycled between deposition and cooling operations until the $\alpha$-$NbO_x$ is a predetermined thickness. In some embodiments, formation of an $\alpha$-$NbO_x$ layer with a thickness of greater than 250 nm and a film loss of less than about 0.03% is obtained. During $\alpha$-$NbO_x$ layer formation, low substrate temperatures are utilized to obtain good layer formation results and improved amorphization.

During $TiO_x$ depositing, it is beneficial to have low film loss while forming a layer with a refractive index of equal to or greater than about 2.75. Forming the $TiO_x$ layer includes applying a bias power to form an electric field across the substrate while heating the substrate. Crystalline (rutile phase) $TiO_x$ has been shown to have a higher refractive index. Higher substrate processing temperatures as well as the application of a radio frequency (RF) bias across the substrate has been shown to increase the refractive index of the $TiO_x$ layer while reducing film loss. Higher RF bias has been shown to densify the $TiO_x$ film and increases to the substrate temperature have been shown to more effectively form rutile phase $TiO_x$.

The substrate carrier described herein has a pocket which is sized to receive a smaller substrate. Gas channels are formed between the bottom surface of the base of the carrier and the pocket in which the substrate is positioned. The gas channels are configured to increase substrate temperature control by increasing thermal conductivity between the substrate and the carrier as well as between the substrate and a heater and/or pedestal on which the carrier is positioned. The substrate carrier described herein provides greatly improved temperature control. In embodiments described herein, the substrate carrier assists in controlling the temperature of the substrate between about 20° C. to about 400° C.

A clamp ring is installed over the substrate to hold the substrate in place within the substrate carrier. The clamp ring prevents the substrate from shifting as gas is applied to the back of the substrate by applying a downward force on the clamp ring opposite the upward force applied by the backside gas and the pressure difference between the volume above the substrate and the volume below the substrate.

In processes such as the $NbO_x$ and $TiO_x$ deposition processes described above, a pressure differential is applied between the pressure within the processing region above the substrate and a volume between the substrate and the substrate carrier. The pressure differential is caused by the application of the backside gas flow. In embodiments in which the process chamber is originally configured to process a 300 mm substrate and a 200 mm substrate is being held by the substrate carrier, the pressure above the substrate is about 1 mTorr to about 6 mTorr while the backside pressure below the substrate is about 3 Torr to about 8 Torr. Therefore, a pressure differential of about 3 to about 8 Torr is applied across the substrate. The clamp ring assists in applying downward force to the substrate. In some embodiments, the clamp ring itself has a mass of greater than about 3 kilograms (kg), such as about 4 kg. In embodiments where a larger pressure differential is utilized, heavier clamp rings may be utilized, such as a clamp ring with a mass of greater than about 7 kg, such as greater than about 8 kg, such as greater than about 9 kg.

However, the increased weight of the clamp rings cause the total substrate carrier and substrate weight to be greater than a general 300 mm substrate. Therefore, transfer devises, such as robots positioned in a transfer chamber or a factory interface, will encounter difficulty moving the carrier accurately and quickly without being redesigned or retrofit. Therefore, additional embodiments which utilize a lighter weight clamp ring are also described. The embodiments with a lighter weight clamp ring make use of clamp rings positioned within each individual process chamber to hold down the clamp ring when a pressure differential is applied.

In yet other embodiments, the clamp ring and the base of the substrate carrier are configured to lock together, such that the clamp ring is not weighted, but still exerts a downward force on the substrate.

FIG. 1 is a schematic cross sectional view of a physical vapor deposition (PVD) process chamber 100. It is to be understood that the PVD chamber 100 described below is an exemplary PVD chamber and other PVD chambers, including PVD chambers from other manufacturers, may be used with or modified to utilize the present disclosure.

The PVD chamber 100 is utilized to form optical devices on a substrate 102. The PVD chamber 100 is configured for utilization of a substrate carrier 111 which holds the substrate 102. The PVD chamber 100 includes a plurality of cathodes including at least one dielectric target cathode 101 and at least one optical device material target cathode 103 having a corresponding plurality of targets including at least one dielectric target 104 and at least one optical device material target 106, for example, a metallic or semiconductor target, attached to the chamber body 108. While FIG. 1 depicts one dielectric target 104 and one optical device material target 106, the PVD chamber 100 may include one or more dielectric targets 104 and/or one or more optical device material targets 106. For example, 3-5 targets selected from at least one of the dielectric targets 104 or the optical device material targets 106 may be included in the PVD chamber 100. In embodiments with the one or more dielectric targets 104 and the one or more optical device material targets 106, each dielectric target 104 is operable to deposit a different dopant material and/or each optical device material target 106 is operable to deposit a different optical device material.

The PVD chamber 100 is configured to include a substrate support 110 having a support surface 112 to support the substrate carrier 111 and the substrate 102. The PVD chamber 100 includes an opening 134 (e.g., a slit valve) through which the optical device substrate may enter a process volume 105 of the PVD chamber 100.

The substrate support 110 includes an RF bias power source 114 coupled to a bias electrode 116 disposed in the substrate support 110. The PVD chamber 100 includes a sputter gas source 136 that provides a sputter gas, such as argon (Ar). The PVD chamber 100 includes a reactive gas source 138 that provides a reactive gas, such as an oxygen-containing gas or a nitrogen-containing gas.

The substrate support 110 includes a mechanism, such as a chamber clamp 142, that retains the substrate carrier 111 or a substrate, such as the substrate 102, on a support surface 112 of the substrate support 110. The mechanism may also include an electrostatic chuck, a vacuum chuck, or the like. The chamber clamp 142 is a retaining clamp and is disposed on top of a shield 140 within the PVD chamber 100. The substrate support 110 is configured to include a cooling conduit 118 disposed in the substrate support 110 where the cooling conduit 118 controllably cools the substrate support 110, the substrate carrier 111, and the substrate 102 positioned thereon to a predetermined temperature, for example between about 20° C. to about 400° C. The cooling conduit 118 is coupled to a cooling fluid source 120 to provide cooling fluid. The substrate support 110 is further configured to include a heater 122 embedded therein. The heater 122, such as a resistive element, disposed in the substrate support 110 is coupled to an optional heater power source 124 and controllably heats the substrate support 110 and the substrate 102 positioned thereon to a predetermined temperature, for example between about 30° C. to 300° C. Each target, for example, the dielectric target 104 or the optical device material target 106, has a DC power source 126 or an RF power source 128 and an associated magnetron. The multiple power sources enable both DC powered processes and RF powered processes to occur in the same PVD chamber 100.

The PVD chamber 100 includes a process gas supply 130 to supply a predetermined process gas to the process volume 105 of the PVD chamber 100. For example, the process gas supply 130 supplies oxygen-containing gas to the process volume 105 to form an oxidizing environment in the process volume 105. The PVD chamber 100 may also include a precursor gas source 132 to supply a precursor gas, for example a gaseous dopant precursor, which is controlled by precursor gas flow controller 131.

Figure 2:
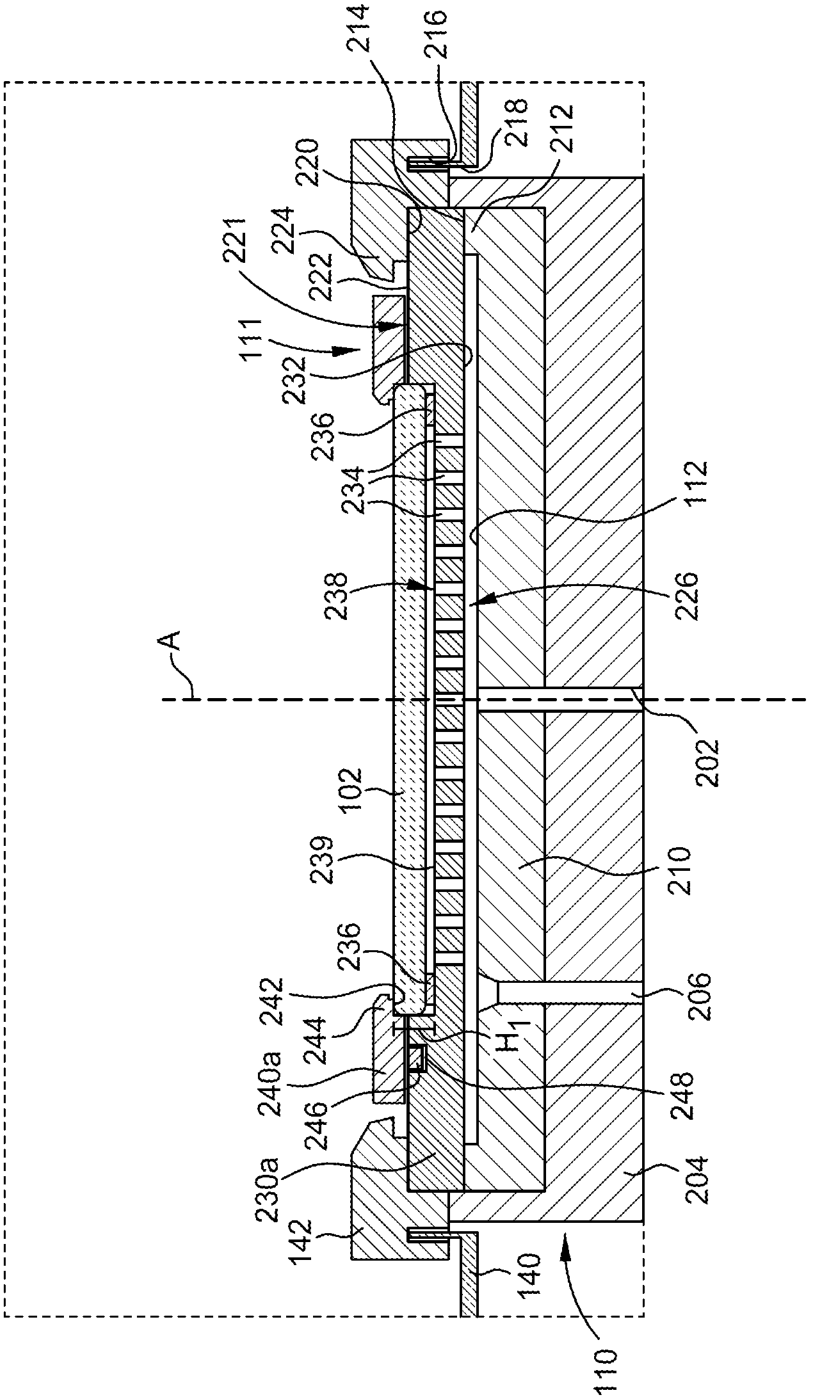
FIG. 2 is a schematic cross sectional view of a carrier positioned on a substrate support, according to embodiments described herein.

FIG. 2 is a schematic cross sectional view of a substrate carrier 111 positioned on the support surface 112 of the substrate support 110. The substrate carrier 111 includes a carrier base 230*a* and a clamp ring 240*a*. The clamp ring 240*a* is disposed on top of the carrier base 230*a*. The substrate 102 is positioned within the substrate carrier 111, such that the clamp ring 240*a* and the carrier base 230*a* hold the substrate 102. The substrate 102 is positioned within a substrate pocket 239. The substrate carrier 111 may be held onto the substrate support 110 by a chamber clamp 142.

The substrate support 110 includes an electrode 210 and a susceptor 204. A backside gas passage 202 is disposed through the substrate support 110 and extends to the support surface 112. One or more exhaust passages may also formed through the substrate support 110 and extend from the support surface 112. The one or more exhaust passages enable pressure buildup caused by the introduction of gas from the backside gas passage 202 to be relieved. A plurality of lift pin holes 206 are formed through the substrate support 110 and are configured to raise and lower the substrate carrier 111 and the substrate 102. The lift pin holes 206 may include a socket disposed therein to assist in maintaining backside pressure and reduce gas leakage through the lift pin holes 206. The docket is disposed at a top of the lift pin holes 206 in a flared portion of the lift pin holes 206 adjacent to the support surface 112.

The carrier base 230*a* of the substrate carrier 111 is disposed on top of the substrate support 110. The support surface 112 of the substrate support 110 includes a carrier support protrusion 212. The carrier support protrusion 212 is disposed radially outward of each of the lift pin holes 206 and the backside gas passage 202. The carrier support protrusion 212 has a top surface 214 which contacts a lower base surface 232 of the carrier base 230*a* and forms a first backside gas plenum 226 between the support surface 112 and the lower base surface 232.

The substrate pocket 239 is a depression extending inward from an upper base surface 222 of the carrier base 230*a*. The substrate pocket 239 is sized to receive a substrate, such as a 200 mm substrate, a 150 mm substrate, or a 100 mm substrate. The substrate pocket 239 extends from the upper base surface 222 towards the lower base surface 232 but does not pass completely to the lower base surface 232. The substrate pocket 239 is centered about a central axis A of the substrate carrier 111. The central axis A is an axis which extends normally to the bottom surface 502 (FIGS. 5A and 5B) of the substrate pocket 239, the lower base surface 232, and the upper base surface 222.

Within the substrate pocket 239 is one or more substrate support features 236 and a plurality of gas channels 234. The plurality of gas channels 234 are formed between the lower base surface 232 and the substrate pocket 239, such that the lower base surface 232 and the substrate pocket 239 are in fluid communication. The plurality of gas channels 234 are configured to allow backside gas to flow from the first backside gas plenum 226 and the backside gas passage 202.

The one or more substrate support features 236 are disposed radially outward of the plurality of gas channels 234. In some embodiments, the one or more substrate support features 236 is a substrate support ring. The one or more substrate support features 236 protrude away from the bottom surface 502 of the substrate pocket 239 and towards a plane in which the upper base surface 222 is disposed. The one or more substrate support features 236 are configured to support the substrate 102 and separate the substrate 102 from the bottom surface 502 of the substrate pocket 239. The one or more substrate support features 236 are centered about the central axis A and configured to form a seal between the substrate 102 and the bottom surface 502 of the substrate pocket 239 to form a second backside gas plenum 238 therebetween. The plurality of gas channels 234 are configured to supply gas to the second backside gas plenum 238 from the first backside gas plenum 226.

Figure 5A:
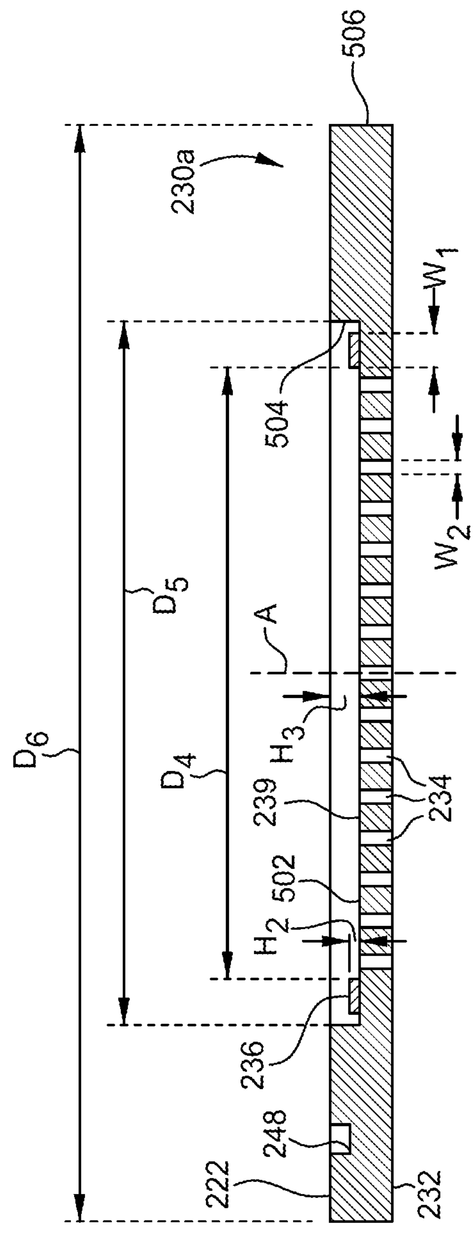
FIG. 5A is a schematic cross sectional view of a carrier base which may be utilized in the embodiment of FIG. 2, according to one embodiment described herein.

The upper base surface 222 further includes one or more base alignment features 248. In some embodiments, the base alignment features 248 are openings extending inward from the upper base surface 222 as shown in FIG. 2 and FIG. 5A. Alternatively, the base alignment features 248 are protrusions extending outward from the upper base surface 222, such as base alignment protrusions 507 of FIG. 5B. The one or more base alignment features 248 are configured to assist in aligning the upper base surface 222 and the clamp ring 240*a*. The one or more base alignment features 248 may include two or more base alignment features 248, such as three or more base alignment features 248. In some embodiments, a single base alignment feature is utilized and is shaped to enable accurate alignment of the clamp ring 240*a* to the carrier base 230*a*. In some embodiments, the one or more base alignment features 248 include a keyed feature to assist in aligning the clamp ring 240*a* with the carrier base 230*a* and locking the clamp ring 240*a* in place, such that the clamp ring 240*a* is positioned on the carrier base 230*a* and then turned slightly to lock the clamp ring 240*a*. Utilizing the one or more base alignment features 248 further prevents rotation of the clamp ring 240*a* and the carrier base 230*a* relative to each other during processing. Preventing rotation of the clamp ring 240*a* relative to the carrier base 230*a* prevents a carrier alignment feature, such as the carrier alignment feature 602 of FIGS. 6A-6D, from being covered during processing and causing system faults or errors in reading the position of the substrate carrier 111.

The clamp ring 240*a* of the substrate carrier 111 is coupled to the upper base surface 222 of the carrier base 230*a*. A lower clamp surface 302 (FIG. 3A) of the clamp ring 240*a* is spaced from the upper base surface 222 and at least partially encloses the substrate 102, while leaving an opening to expose the top surface of the substrate 102 to a processing volume. Spacing the lower clamp surface 302 from the upper base surface 222 forms a gap 221 therebetween. The presence of the gap 221 assists in ensuring the full weight of the clamp ring 240*a* rests on the substrate 102 to counter backside pressure formed in the second backside gas plenum 238. The gap 221 is less than about 0.5 mm, such as less than about 0.3 mm, such as less than about 0.2 mm, such as about 0.1 mm to about 0.2 mm. The clamp ring 240*a* is centered about the central axis A, such that the opening formed by the clamp ring 240*a* is centered about the central axis A.

The lower clamp surface 302 (FIG. 3A) of the clamp ring 240*a* includes one or more clamp ring alignment features 246. The clamp ring alignment features 246 are sized and positioned to enable interlocking between the one or more clamp ring alignment features 246 and the one or more base alignment features 248. Therefore, the number of clamp ring alignment features 246 is the same as the number of base alignment features 248. The clamp ring alignment features 246 are an inverse shape to the base alignment features 248 to enable interlocking thereof. Therefore, when the base alignment features 248 form an opening as shown in FIG. 2, the clamp ring alignment features 246 are one or more protrusions which extends away from the lower clamp surface 302 and into the opening formed by the base alignment features 248. Alternatively, when the base alignment features 248 form protrusions, such as the base alignment protrusions 507 of FIG. 5B, the clamp ring alignment features 246 form openings to receive the protrusions, such as the openings 310 of FIG. 3B.

An inner protrusion 244 extends radially inward of the main body of the clamp ring 240*a* and over an edge of the substrate 102. Therefore, the inner protrusion 244 forms a lip 242 over the substrate 102 and extends over the substrate pocket 239.

The clamp ring 240*a* and the carrier base 230*a* form a gap in which the substrate 102 is disposed. The lip 242 of the inner protrusion 244 and the bottom surface 502 of the substrate pocket 239 form a substrate receiving space. The height $H_1$ between the lip 242 of the inner protrusion 244 and the bottom surface 502 of the substrate pocket 239 is sized to accommodate a substrate.

In embodiments in which the substrate carrier 111 is configured to hold a 100 mm substrate, the height $H_1$ is about 500 μm to about 550 μm, such as about 515 μm to about 535 μm, such as about 525 μm to about 530 μm. In embodiments in which the substrate carrier 111 is configured to hold a 125 mm substrate, the height $H_1$ is about 600 μm to about 650 μm, such as about 615 μm to about 635 μm, such as about 625 μm to about 630 μm. In embodiments in which the substrate carrier 111 is configured to hold a 150 mm substrate, the height $H_1$ is about 650 μm to about 700 μm, such as about 665 μm to about 690 μm, such as about 675 μm to about 680 μm. In embodiments in which the substrate carrier 111 is configured to hold a 200 mm substrate, the height $H_1$ is about 700 μm to about 750 μm, such as about 715 μm to about 735 μm, such as about 725 μm to about 730 μm. The height $H_1$ is large enough to accommodate a substrate of a specific size, but small enough to prevent shifting of the substrate within the substrate pocket 239.

The chamber clamp 142 is configured to hold the substrate carrier 111 on the substrate support 110. The chamber clamp 142 is configured to actuate upwards and downwards as the substrate support 110 is raised and lowered. The chamber clamp 142 is positioned to rest on the shield 140 while the substrate support 110 is in a lowered position and is raised when the substrate support 110 and/or the substrate carrier 111 contact a clamping surface 220 of the chamber clamp 142. The shield 140 includes a vertical portion 218 which is configured to extend inside of a support slit 216 of the chamber clamp 142. The support slit 216 is formed from a lower surface of the chamber clamp 142 and is configured to receive the vertical portion 218 of the shield 140 to enable the chamber clamp 142 to be supported by the shield 140 when in a lowered position and to be lifted off of the shield 140 when in a raised position. The clamping surface 220 is a lower surface of the inner chamber clamp protrusion 224, which is a portion of the chamber clamp 142 which extends radially inward over at least a portion of the substrate carrier 111. The chamber clamp 142 may be configured to contact either the carrier base 230*a*, the clamp ring 240*a*, or both the carrier base 230*a* and the clamp ring 240*a*. The chamber clamp 142 is weighted to help keep the carrier base 230*a* and the clamp ring 240*a* in place on the substrate support 110. The chamber clamp 142 therefore has a mass of greater than about 3 kg, such as about 4 kg. In embodiments where a larger pressure differential is utilized, heavier chamber clamps 142 may be utilized, such as a chamber clamp 142 with a mass of greater than about 7 kg, such as greater than about 8 kg, such as greater than about 9 kg. The increased mass of the chamber clamp 142 does not cause alignment or transfer errors within the overall substrate carrier 111, as the chamber clamp 142 remains in the PVD chamber 100 between process operations.

Figure 3A:
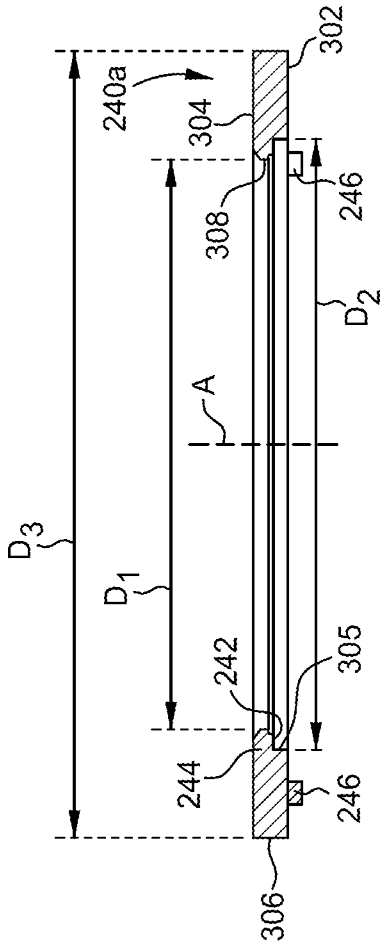
FIG. 3A is a schematic cross sectional view of a clamp ring which may be utilized in the embodiment of FIG. 2, according to one embodiment described herein.

FIG. 3A is a schematic cross sectional view of the clamp ring 240*a* as utilized in the embodiment of FIG. 2. The clamp ring 240*a* is a first embodiment of the clamp ring 240*a* which may be utilized in the substrate carrier 111 of FIG. 2. The clamp ring 240*a* includes one or more clamp ring alignment features 246 which are protrusions from the lower clamp surface 302.

The clamp ring 240*a* includes an outer clamp surface 306 and an inner clamp surface 308. Both the outer clamp surface 306 and the inner clamp surface 308 are circular surfaces and are centered about the central axis A. The inner clamp surface 308 and the outer clamp surface 306 are concentric. In some embodiments, one or both of the outer clamp surface 306 and the inner clamp surface 308 include a flat edge, such as the flat edge 402 of the outer clamp surface 306 shown in FIG. 4.

The lower clamp surface 302 is disposed radially inward of the outer clamp surface 306 and extends between the outer clamp surface 306 and the inner clamp surface 308. An upper clamp surface 304 is disposed radially inward of the outer clamp surface 306 and also extends between the outer clamp surface 306 and the inner clamp surface 308. The upper clamp surface 304 and the lower clamp surface 302 are formed opposite one another. The one or more clamp ring alignment features 246 extend from the lower clamp surface 302.

The inner clamp surface 308 forms an innermost surface of the clamp ring 240*a*, such that the inner clamp surface 308 is the radially innermost surface of the inner protrusion 244. The inner clamp surface 308 is configured to have a first diameter $D_1$. The first diameter $D_1$ is less than the diameter of a substrate positioned within the substrate carrier 111. The lip 242 extends from the bottom of the inner clamp surface 308 and radially outwards. The lip 242 is parallel to one or both of the lower clamp surface 302 and the upper clamp surface 304 as well as the top surface of a substrate positioned within the substrate carrier 111.

The first diameter $D_1$ varies with the size of the substrate being processed. When a 100 mm substrate is positioned within the substrate carrier 111, the first diameter $D_1$ is about 75 mm to about 98 mm, such as about 80 mm to about 95 mm, such as about 85 to about 95 mm. When a 125 mm substrate is positioned within the substrate carrier 111, the first diameter $D_1$ is about 100 mm to about 123 mm, such as about 115 mm to about 120 mm, such as about 118 to about 120 mm. When a 150 mm substrate is positioned within the substrate carrier 111, the first diameter $D_1$ is about 125 mm to about 148 mm, such as about 130 mm to about 145 mm, such as about 135 to about 145 mm, such as about 140 mm to about 145 mm. When a 200 mm substrate is positioned within the substrate carrier 111, the first diameter $D_1$ is about 175 mm to about 198 mm, such as about 180 mm to about 195 mm, such as about 185 to about 195 mm.

The lower portion 305 of the inner clamp surface 308 is disposed radially outward from the innermost portion of the inner clamp surface 308. The lower portion 305 is similarly centered about the central axis A but has a larger diameter than the inner clamp surface 308. The lower portion 305 has a second diameter $D_2$. The second diameter $D_2$ is slightly larger than the first diameter $D_1$. The second diameter $D_2$ is configured to be slightly larger than the substrate which is positioned within the substrate carrier 111.

When a 100 mm substrate is positioned within the substrate carrier 111, the second diameter $D_2$ is about 101 mm to about 110 mm, such as about 102 mm to about 105 mm, such as about 103 to about 105 mm. When a 125 mm substrate is positioned within the substrate carrier 111, the second diameter $D_2$ is about 126 mm to about 140 mm, such as about 126 mm to about 130 mm, such as about 128 mm to about 130 mm. When a 150 mm substrate is positioned within the substrate carrier 111, the second diameter $D_2$ is about 151 mm to about 165 mm, such as about 152 mm to about 160 mm, such as about 152 to about 155 mm. When a 200 mm substrate is positioned within the substrate carrier 111, the second diameter $D_2$ is about 201 mm to about 215 mm, such as about 202 mm to about 210 mm, such as about 202 to about 205 mm. The difference between the first diameter $D_1$ and the second diameter $D_2$ is about 1 mm to about 15 mm, such as about 3 mm to about 10 mm, such as about 5 mm to about 10 mm.

The outer clamp surface 306 has a third diameter $D_3$. The third diameter $D_3$ is greater than both the first diameter $D_1$ and the second diameter $D_2$. The third diameter $D_3$ varies depending upon the configuration of the substrate carrier 111. In some embodiments, the third diameter $D_3$ varies with the size of the substrate positioned within the substrate carrier 111. When a 100 mm substrate is positioned within the substrate carrier 111, the third diameter $D_3$ is about 125 mm to about 310 mm, such as about 150 mm to about 310 mm, such as about 200 mm to about 305 mm. When a 125 mm substrate is positioned within the substrate carrier 111, the third diameter $D_3$ is about 150 mm to about 310 mm, such as about 200 mm to about 310 mm, such as about 225 mm to about 305 mm. When a 150 mm substrate is positioned within the substrate carrier 111, the third diameter $D_3$ is about 175 mm to about 310 mm, such as about 200 mm to about 310 mm, such as about 250 mm to about 305 mm. When a 200 mm substrate is positioned within the substrate carrier 111, the third diameter $D_3$ is about 225 mm to about 310 mm, such as about 250 mm to about 310 mm, such as about 275 mm to about 305 mm.

Figure 3B:
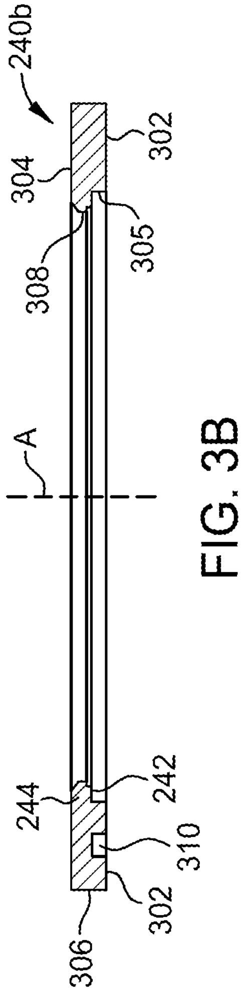
FIG. 3B is a schematic cross sectional view of another clamp ring which may be utilized in the embodiment of FIG. 2, according to another embodiment described herein.

FIG. 3B is a schematic cross sectional view of another clamp ring 240*b* which may be utilized in the embodiment of FIG. 2. The clamp ring 240*b* of FIG. 3B is similar to the clamp ring 240*a* of FIG. 3A, but the one or more clamp ring alignment features 246 are openings 310 extending into the body of the clamp ring 240*b* from the lower clamp surface 302. The openings 310 are cylindrical openings and are configured to receive a protrusion, such as the base 1000 alignment protrusions 507 of FIG. 5B.

Figure 4:
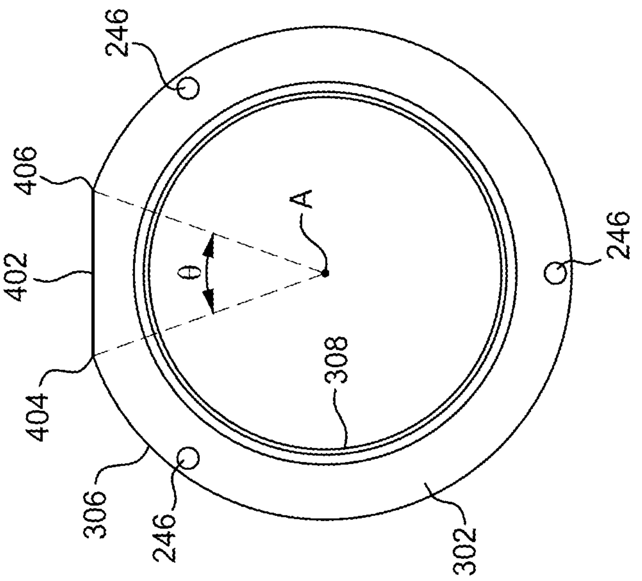
FIG. 4 is a schematic bottom view of the clamp ring of FIG. 3A, according to one embodiment described herein.

FIG. 4 is a schematic bottom view of the clamp ring 240*a* of FIG. 3A. The bottom view of the clamp ring 240*b* of FIG. 3B is similar to the view of FIG. 4. As shown in FIG. 4, the clamp ring 240*a* includes a flat edge 402 along the outer clamp surface 306. The flat edge 402 may assist with alignment of the clamp ring 240*a*, such that an alignment feature formed on the carrier base 230*a* is exposed when the clamp ring 240*a* is disposed thereon. Alternatively, the flat edge 402 is configured to be aligned with a portion of the substrate disposed within the substrate carrier 111.

The flat edge 402 forms a chord along one side of the outer clamp surface 306, such that the circular portion of the outer clamp surface 306 and the flat edge 402 intersect at a first end 404 and a second end 406 of the flat edge 402. The flat edge 402 is disposed between the first end 404 and the second end 406. The flat edge 402 forms a small portion of the outer clamp surface 306, such that an angular difference θ between the first end 404 and the second end 406 along the outer clamp surface 306 is small. In embodiments described herein, the angular difference θ is less than about 20 degrees, such as about 1 degree to about 20 degrees, such as about 2 degrees to about 15 degrees, such as about 2 degrees to about 10 degrees. The angular difference θ is the angle about the central axis A in which the flat edge 402 is formed. Having a relatively small angular difference θ enables alignment of the clamp ring 240*a* and the carrier base 230*a* while reducing force imbalance between different portions of a substrate and enables more uniform thermal conduction.

FIG. 5A is a schematic cross sectional view of a carrier base 230*a* as utilized in the embodiment of FIG. 2. The carrier base 230*a* is a first embodiment of the carrier base 230*a* which may be utilized in the substrate carrier 111 of FIG. 2. The carrier base 230*a* includes one or more base alignment features 248 which are openings extending inward from the upper base surface 222.

The carrier base 230*a* includes an outer base surface 506 which connects the upper base surface 222 and the lower base surface 232. The upper base surface 222 and the lower base surface 232 protrude radially inward from the outer base surface 506. The upper base surface 222 and the lower base surface 232 are on opposite sides of the carrier base 230*a*, such that the carrier base 230*a* forms a disk with the outer base surface 506 forming the outer circumference of the disk.

The bottom surface 502 of the substrate pocket 239 includes the plurality of gas channels 234 formed therethrough as well as the one or more substrate support features 236. In embodiments described herein, the one or more substrate support features 236 is a singular substrate support feature and includes an annular substrate support ring extending from the bottom surface 502 upwards towards the upper base surface 222. The substrate support feature 236 forms a seal between a substrate and the carrier base 230*a*, such that the gas introduced by the plurality of gas channels 234 is maintained within a plenum between the substrate and the bottom surface 502.

The substrate support feature 236 has a second height $H_2$. The substrate pocket 239 has a third height $H_3$. The third height $H_3$ is measured between the upper base surface 222 and the bottom surface 502 of the substrate pocket 239. The second height $H_2$ is less than a third height $H_3$. The second height $H_2$ is a height large enough to separate a substrate positioned within the substrate pocket 239 from the bottom surface 502, such that the center of the substrate does not contact the bottom surface 502. The second height $H_2$ and the third height $H_3$ are changed to ensure the clamp ring alignment features 246 and the base alignment features 248 remain mated during processing, such that the second height $H_2$ and the third height $H_3$ are configured to control the amount of the substrate 102 positioned above the upper base surface 222.

The second height $H_2$ is about 0.05 mm to about 0.15 mm, such as about 0.08 mm to about 0.12 mm, such as about 0.09 mm to about 0.11 mm. The third height $H_3$ is configured to reduce sliding of the substrate 102 within the substrate pocket 239. In some embodiments, the difference between the third height $H_3$ and the second height $H_2$ is at least about 0.15 mm to about 0.3 mm, such as about 0.2 mm to prevent wafer sliding. The third height $H_3$ is about 200 μm to about 450 μm, such as about 250 μm to about 400 μm, such as about 275 μm to about 350 μm.

Each of the gas channels 234 is disposed radially inward of the substrate support feature 236. The substrate support feature has an inner surface with a fourth diameter $D_4$. The fourth diameter $D_4$ is also the outermost diameter at which the gas channels 234 are formed through the bottom surface 502 of the substrate pocket 239. The overall substrate pocket 239 has a fifth diameter $D_5$, such that the substrate pocket 239 has a cylindrical sidewall 504 with a fifth diameter $D_5$. The fourth diameter $D_4$ is smaller than the fifth diameter $D_5$. The fourth diameter $D_4$ is about 2.5 mm to about 10 mm less than the fifth diameter $D_5$, such as about 3 mm to about 8 mm less than the fifth diameter $D_5$, such as about 3 mm to about 7 mm less than the fifth diameter $D_5$, such as about 3 mm to about 5 mm less than the fifth diameter $D_5$. The fourth diameter $D_4$ and the fifth diameter $D_5$ vary depending on the size of the substrate. The fifth diameter $D_5$ is larger than the size of the substrate positioned within the substrate pocket 239, but small enough to reduce shifting within the substrate pocket 239.

When a 100 mm substrate is positioned within the substrate carrier 111, the fifth diameter $D_5$ is about 101 mm to about 110 mm, such as about 102 mm to about 105 mm, such as about 103 to about 105 mm. When a 125 mm substrate is positioned within the substrate carrier 111, the fifth diameter $D_5$ is about 126 mm to about 140 mm, such as about 126 mm to about 130 mm, such as about 128 mm to about 130 mm. When a 150 mm substrate is positioned within the substrate carrier 111, the fifth diameter $D_5$ is about 151 mm to about 165 mm, such as about 152 mm to about 160 mm, such as about 152 to about 155 mm. When a 200 mm substrate is positioned within the substrate carrier 111, the fifth diameter $D_5$ is about 201 mm to about 215 mm, such as about 202 mm to about 210 mm, such as about 202 to about 205 mm.

When a 100 mm substrate is positioned within the substrate carrier 111, the fourth diameter $D_4$ is about 90 mm to about 97 mm, such as about 94 mm to about 97 mm, such as about 95 to about 97 mm. When a 125 mm substrate is positioned within the substrate carrier 111, the fourth diameter $D_4$ is about 115 mm to about 122 mm, such as about 118 mm to about 122 mm, such as about 120 mm to about 122 mm. When a 150 mm substrate is positioned within the substrate carrier 111, the fourth diameter $D_4$ is about 140 mm to about 147 mm, such as about 142 mm to about 147 mm, such as about 145 to about 147 mm. When a 200 mm substrate is positioned within the substrate carrier 111, the fourth diameter $D_4$ is about 190 mm to about 197 mm, such as about 193 mm to about 197 mm, such as about 195 to about 197 mm.

The outer base surface 506 has a sixth diameter $D_6$. The sixth diameter $D_6$ is configured to be similar to the diameter of a substrate which the PVD chamber 100 is configured to process. Therefore, the sixth diameter $D_6$ is configured to be similar in diameter to a 300 mm or a 200 mm diameter substrate. When the PVD chamber 100 is configured to operate using a 300 mm substrate, the sixth diameter $D_6$ is about 295 mm to about 305 mm, such as about 297 mm to about 303 mm, such as about 298 mm to about 302 mm, such as about 299 mm to about 301 mm. When the PVD chamber 100 is configured to operate using a 200 mm substrate, the sixth diameter $D_6$ is about 195 mm to about 205 mm, such as about 197 mm to about 203 mm, such as about 198 mm to about 202 mm, such as about 199 mm to about 201 mm.

The width of the substrate support feature 236 along the radial direction from the central axis A is a first width $W_1$. The width of the substrate support feature 236 is configured to enable good support of a substrate while reducing thermal interaction of the substrate with the carrier base 230*a*. The first width $W_1$ is about 1.0 mm to about 3.0 mm, such as about 1.5 mm to about 2.5 mm, such as about 1.8 mm to about 2.2 mm, such as about 2.0 mm.

Each of the gas channels 234 further have a second width $W_2$. The second width $W_2$ is the diameter of each of the gas channels 234 as the gas channels pass through the carrier base 230*a*. The second width $W_2$ is large enough to enable adequate gas flow through the carrier base 230*a* to control the temperature of the substrate, but small enough to reduce any non-uniformities formed through an electric field which passes through the substrate. If the gas channels 234 are larger in size, the gas channels will cause inconsistencies in the medium through which the electric field passes and cause non-uniformities on the substrate during processing. Large diameter gas channels 234 also increase the risk of plasma ignition within the gas channels 234 during application of an RF bias to a substrate support pedestal, such as the substrate support 110. The second width $W_2$ is about 10 mils to about 75 mils, such as about 15 mils to about 55 mils, such as about 16 mils to about 50 mils. The plurality of gas channels 234 includes over 100 gas channels, such as over 200 gas channels, such as over 300 gas channels, such as over 500 gas channels, such as over 700 gas channels. The number of gas channels 234 changes depending upon the size of substrate positioned within the substrate pocket 239. The gas channels 234 fluidly connect the lower base surface 232 and the substrate pocket 239.

Figure 5B:
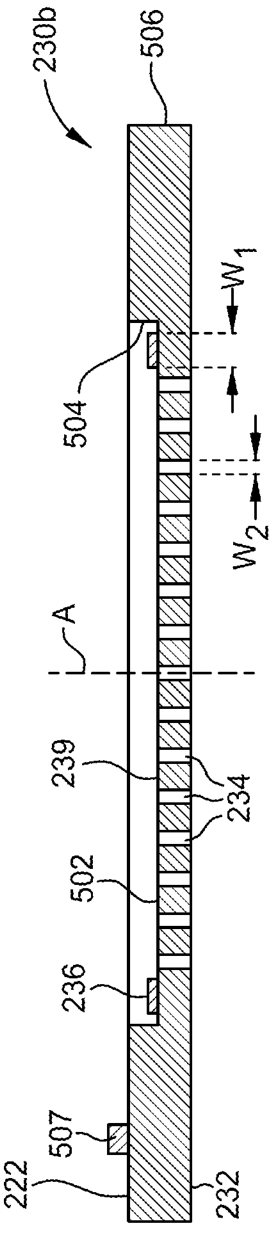
FIG. 5B is a schematic cross sectional view of another carrier base which may be utilized in the embodiment of FIG. 2, according to another embodiment described herein.

FIG. 5B is a schematic cross sectional view of a second embodiment of a carrier base 230*b* which may be utilized in the embodiment of FIG. 2. The carrier base 230*b* is similar to the carrier base 230*a* of FIG. 5A, but the base alignment features 248 are replaced with base alignment protrusions 507. The base alignment protrusions 507 are cylindrical protrusions and are configured to extend into an opening, such as the openings 310 within the clamp ring 240*b* of FIG. 3B. There may be single protrusion 507 or a plurality of protrusions 507, such as two protrusions 507, three protrusions 507, or four protrusions 507. The protrusions assist in aligning the carrier base 230*b* and the clamp ring 240*b* during assembly and hold the clamp ring 240*b* in place during transfer and during processing of a substrate.

Figure 6B:
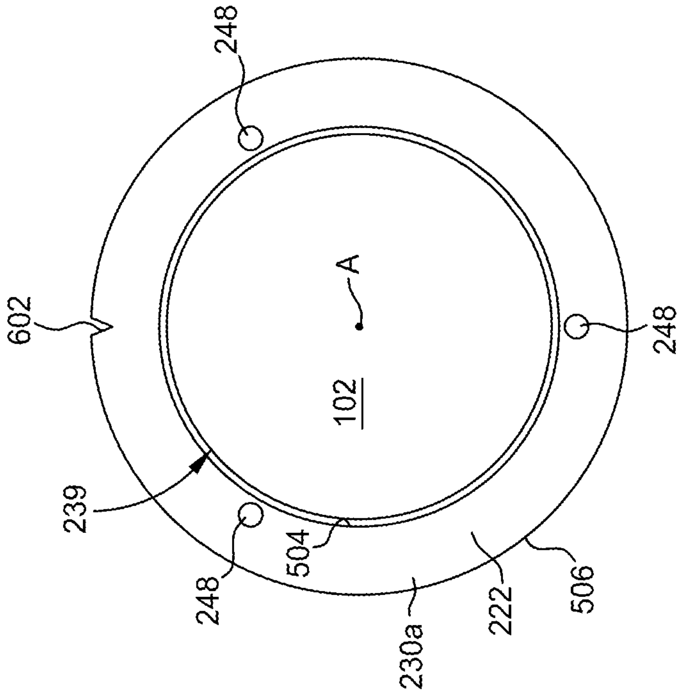
FIGS. 6A-6D are schematic plan views of the carrier during various stages of assembly, according to embodiments described herein.
Figure 6A:
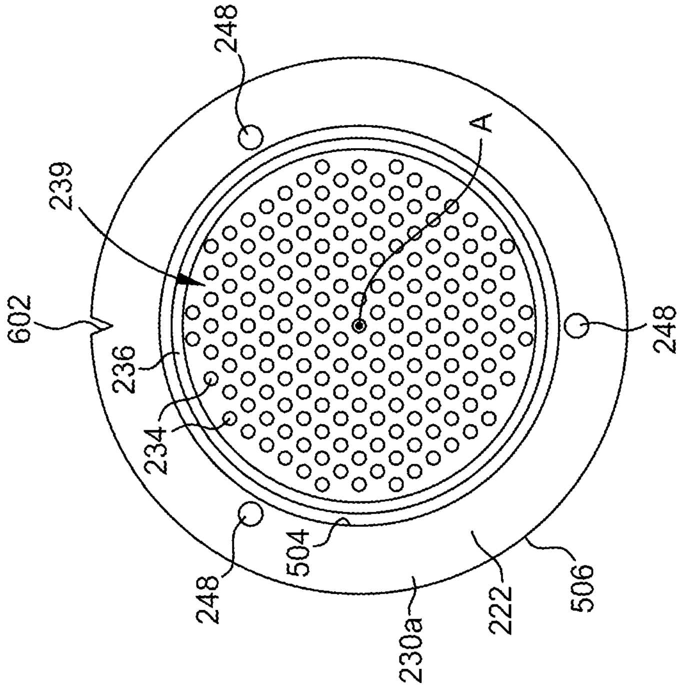

FIGS. 6A-6D are schematic plan views of the substrate carrier 111 during various stages of assembly. FIG. 6A illustrates the carrier base 230*a* without a substrate or a clamp ring disposed thereon. The carrier base 230*a* includes the substrate support feature 236 being an annular support feature with each of the gas channels 234 disposed radially inward of the substrate support feature 236. The substrate is configured to be positioned radially inward of the cylindrical sidewall 504. Each of the base alignment features are positioned evenly spaced around the substrate pocket 239. The carrier base 230*a* includes a carrier alignment feature radially outward of the one or more base alignment features. The carrier alignment feature 602 is shown as an alignment notch formed on the upper base surface 222 and the outer base surface 506.

FIG. 6B illustrates the carrier base 230*a* after a substrate 102 is placed within the substrate pocket 239. The substrate 102 is positioned on the substrate support feature 236 and centered within the substrate pocket 239. The substrate 102 is placed in the substrate pocket 239 before the clamp ring 240*a* is placed on the carrier base 230*a*. The clamp ring 240*a* is placed on top of the carrier base 230*a* in FIG. 6C, such that the clamp ring 240*a* and the carrier base 230*a* partially enclose the substrate 102. The center of the substrate 102 is left exposed. In embodiments such as that shown in FIG. 6C, the outer radius of the clamp ring 240*a* is less than the outer radius of the carrier base 230*a*, such that an outer portion of the upper base surface 222 is an exposed surface 604. The exposed surface 604 may be gripped by a chamber clamp 142 without the chamber clamp 142 contacting the clamp ring 240*a*.

Figure 6D:
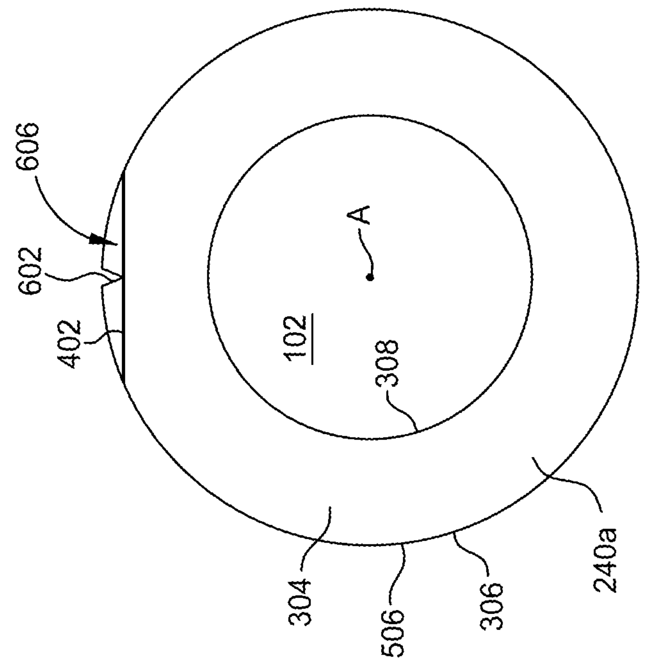
Figure 6C:
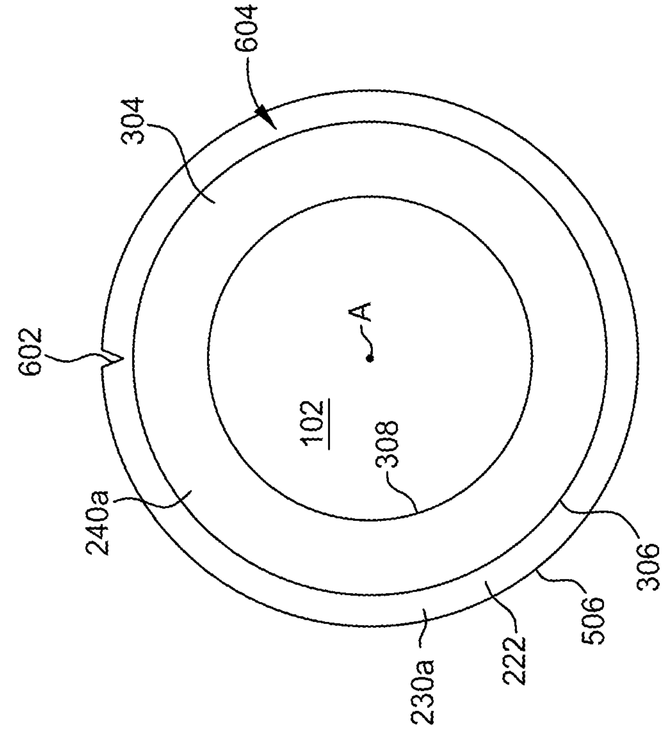

FIG. 6D illustrates an embodiment in which the outer diameter of the clamp ring 240*a* is similar or larger than the outer diameter of the carrier base 230*a*. In the embodiment of FIG. 6D, the outer diameter of the clamp ring 240*a* is similar to the outer diameter of the carrier base 230*a*. When the outer diameters of the clamp ring 240*a* and the carrier base 230*a* are similar, the outer clamp surface 306 includes the flat edge 402. The flat edge 402 forms an exposed portion 606 of the upper base surface 222. The exposed portion 606 includes the carrier alignment feature 602. The flat edge 402 and the carrier alignment feature 602 are aligned such that the carrier alignment feature 602 is exposed.

Figure 7:
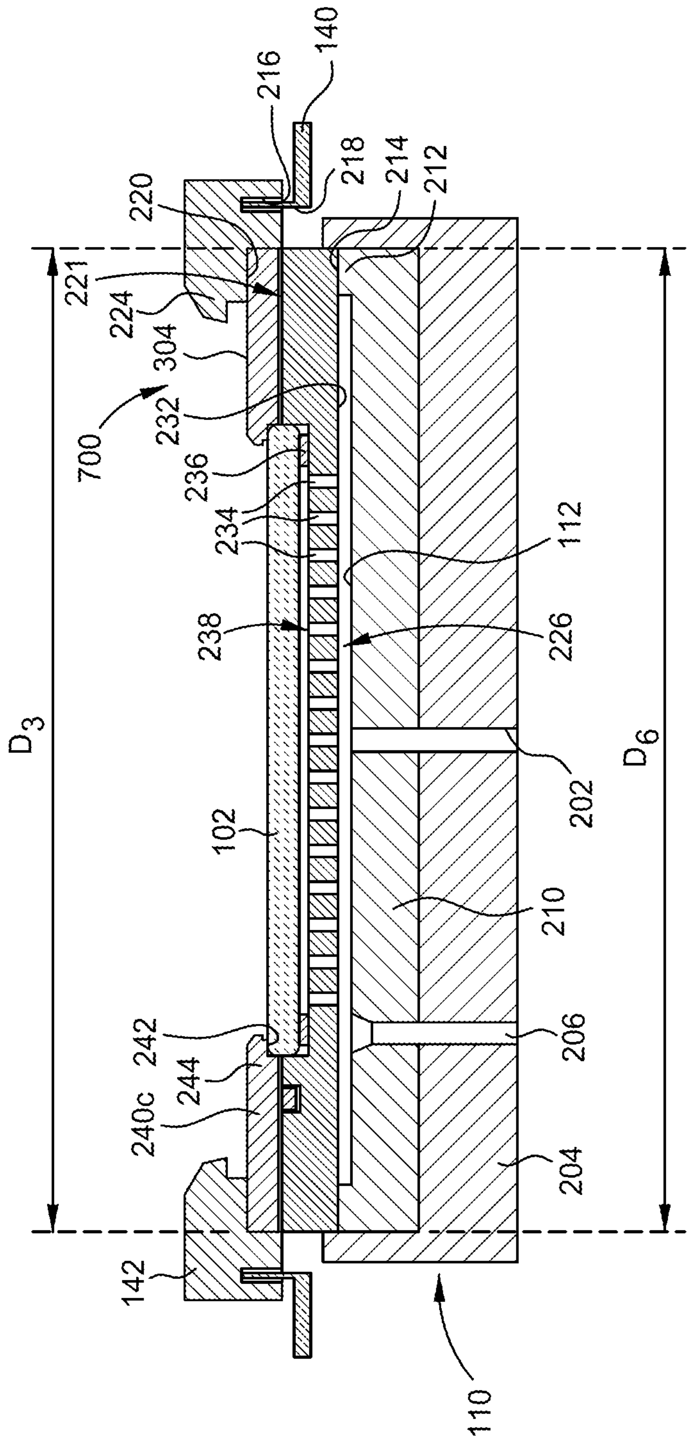
FIG. 7 is a schematic cross sectional view of another carrier positioned on a substrate support, according to another embodiment described herein.

FIG. 7 is a schematic cross sectional view of a substrate carrier 700 positioned on the substrate support 110. The substrate carrier 700 is similar to the substrate carrier 111, but the clamp ring 240*a* is replaced by the clamp ring 240*c* which has a third diameter $D_3$ of the outer clamp surface 306 similar to the sixth diameter De of the outer base surface 506. The third diameter $D_3$ and the sixth diameter $D_6$ have a difference of less than about 15 mm for the substrate carrier 700, such as a difference of less than about 10 mm, such as a difference of less than about 5 mm, such as a difference of less than about 1 mm.

Extending the third diameter $D_3$ to about the same as the sixth diameter $D_6$ enables the clamp ring 240*c* to be clamped by the chamber clamp 142. The use of the chamber clamp 142 to clamp the clamp ring 240*c* enables the clamp ring mass to be reduced and reduces strain on transfer components within the processing system. The thickness of the total substrate carrier 700 is also reduced compared to the total thickness of the substrate carrier 111. In the embodiment of FIG. 7, the mass of the substrate carrier 700 without the substrate 102 is less than about 250 grams, such as about 100 grams to about 250 grams, such as about 150 grams to about 200 grams, such as about 160 to about 180 grams. The total thickness of the substrate carrier 700, in the direction parallel to the central axis A, is less than about 2.0 mm, such as less than about 1.7 mm, such as about 1.5 mm to about 1.7 mm. The total mass of the total substrate carrier 700 is configured to be less than two times the mass of a substrate with a similar outer diameter. Therefore, for substrate carriers 700 configured to have a similar outer diameter to a 300 mm substrate, which has a mass of about 125 grams, the substrate carrier 700 has a mass of less than about 250 grams. The total mass of the total substrate carrier 700 configured to have an outer diameter similar to an outer diameter of a 200 mm substrate, which has a mass of about 53 grams, the substrate carrier 700 has a mass of less than about 110 grams, such as less than about 100 grams.

The material of each of the clamp rings 240*a*, 240*b*, 240*c* and the carrier bases 230*a*, 230*b*, 230*c* is configured to enable good thermal conductivity while reducing contamination or damage to the substrate 102. As described herein, the substrate 102 is an optical device and is formed of silicon, such as glass. The clamp ring 240*a* and the carrier base 230*a* may be a similar material, such as mono-crystalline silicon. In other embodiments, the clamp ring 240*a* and the carrier base 230*a* are a metal material such as titanium or aluminum.

Figure 8:
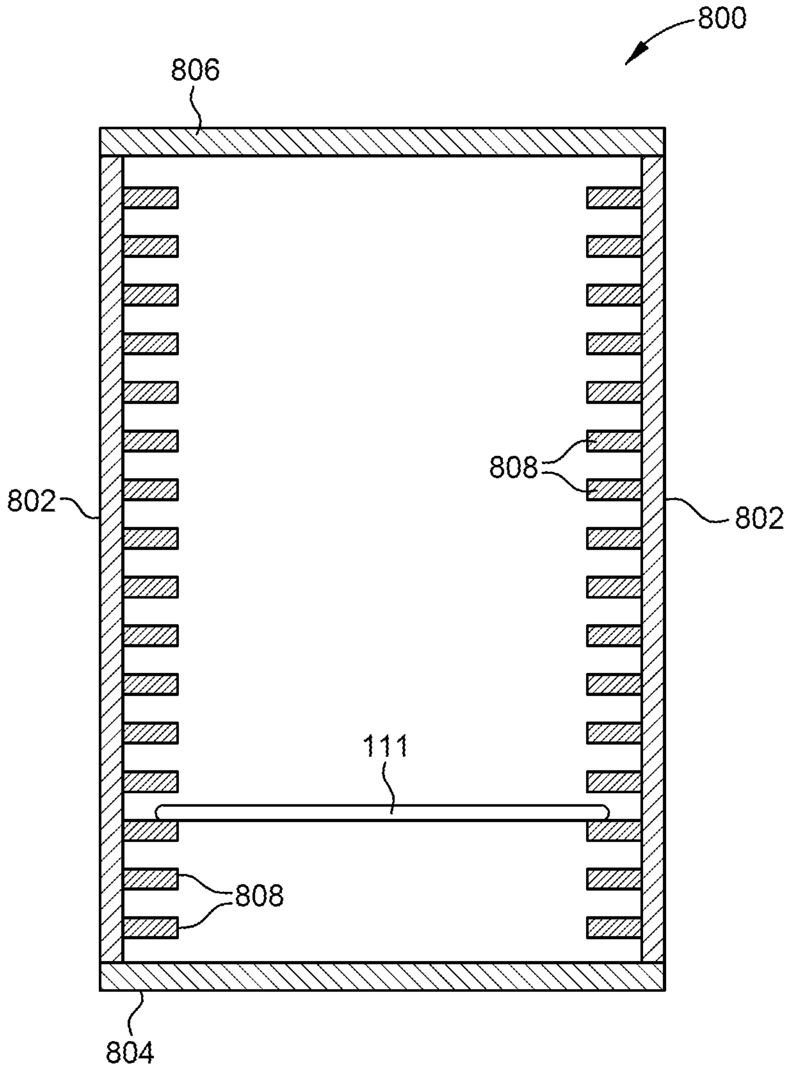
FIG. 8 is a schematic cross-sectional view of a substrate cassette configured to hold a plurality of substrates or substrate carriers, according to another embodiment described herein.

FIG. 8 is a schematic cross-sectional view of a substrate cassette 800 configured to hold a plurality of substrates 102 and substrate carriers 111. The substrate cassette 800 includes a plurality of shelves 808. Each shelf 808 is configured to receive and support a substrate carrier 111. The substrate cassette 800 is originally configured to support substrates, such as 300 mm substrates. However, when smaller substrates are utilized, the substrate carrier 111 is configured to be held within the substrate cassette 800. Therefore, the size and weight of the substrate carrier 111 is further configured to enable placement within a cassette, such as the substrate cassette 800. The substrate cassette 800 further includes sidewalls 802, a top plate 806, and a bottom plate 804.

Figure 9:
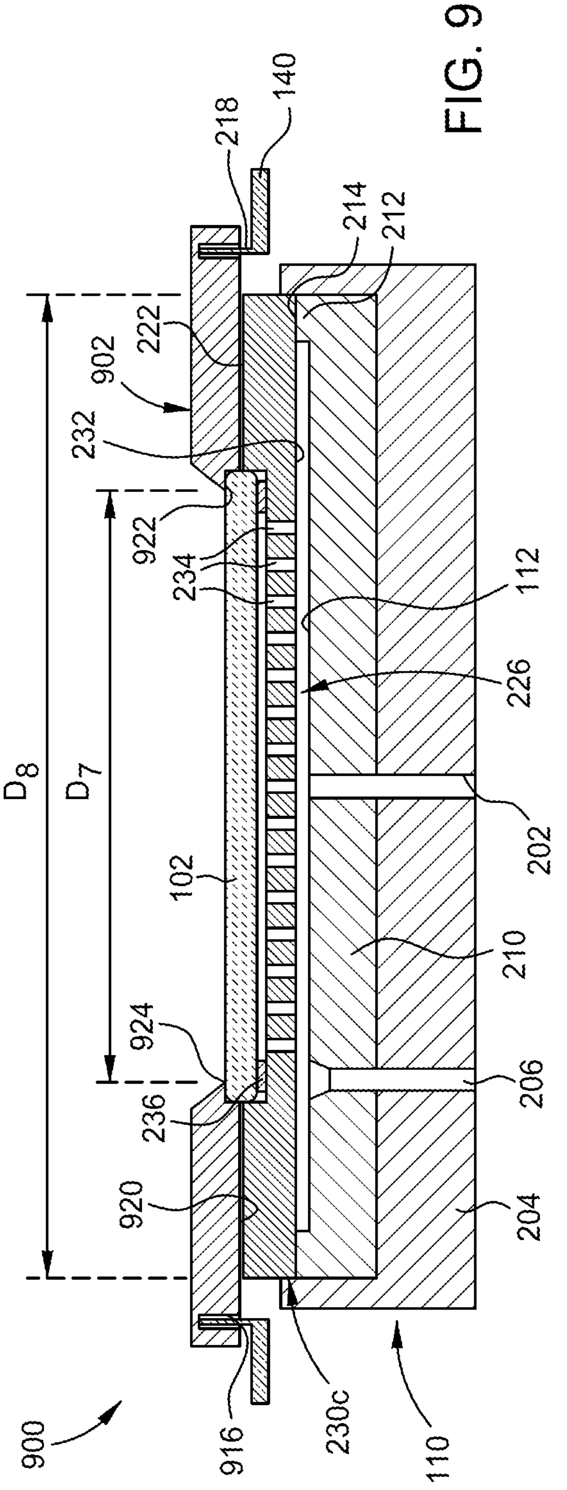
FIG. 9 is a schematic cross sectional view of another carrier positioned on a substrate support, according to another embodiment described herein.

FIG. 9 is a schematic cross sectional view of another substrate carrier 900 positioned on a substrate support 110. The substrate carrier 900 is similar to the substrate carrier 111 of FIG. 2, but the chamber clamp 142 and the clamp ring 240*a* are replaced with the chamber clamp ring 902. The carrier base 230*a* is further replaced with the carrier base 230*c*. In some embodiments, the carrier base 230*c* does not include base alignment features 248. The chamber clamp ring 902 is disposed on top of the shield 140 and includes a support slit 916 similar to the support slit 216 of the substrate carrier 111. The chamber clamp ring 902 is configured to clamp the substrate 102 and extends from radially outward of the carrier base 230*a* to radially inward of an outer edge of the substrate 102 and an outer edge of the substrate pocket 239. The substrate 102 is clamped by a lip 922 formed as a part of the bottom surface of the chamber clamp ring 902. The lip 922 is similar to the lip 242 of the clamp ring 240*a*. An inner edge 924 of the chamber clamp ring 902 is disposed radially inward of the outer edge of the substrate 102, the outer edge of the substrate pocket 239, and the lip 922.

The inner edge 924 has a seventh diameter $D_7$. The seventh diameter $D_7$ is similar to the first diameter $D_1$. The seventh diameter $D_7$ varies with the size of the substrate being processed. When a 100 mm substrate is positioned within the substrate carrier 900, the seventh diameter $D_7$ is about 75 mm to about 98 mm, such as about 80 mm to about 95 mm, such as about 85 to about 95 mm. When a 125 mm substrate is positioned within the substrate carrier 900, the seventh diameter $D_7$ is about 100 mm to about 123 mm, such as about 115 mm to about 120 mm, such as about 118 to about 120 mm. When a 150 mm substrate is positioned within the substrate carrier 900, the seventh diameter $D_7$ is about 125 mm to about 148 mm, such as about 130 mm to about 145 mm, such as about 135 to about 145 mm, such as about 140 mm to about 145 mm. When a 200 mm substrate is positioned within the substrate carrier 900, the seventh diameter $D_7$ is about 175 mm to about 198 mm, such as about 180 mm to about 195 mm, such as about 185 to about 195 mm.

The outer edge of the chamber clamp ring 902 has an eighth diameter $D_8$. The eighth diameter $D_8$ is greater than the sixth diameter $D_6$, such that the eighth diameter $D_8$ extends radially outward of the outer base surface 506 of the carrier base 230*a* (FIG. 5A) and over the vertical portion 218 of the shield 140.

Figure 10:
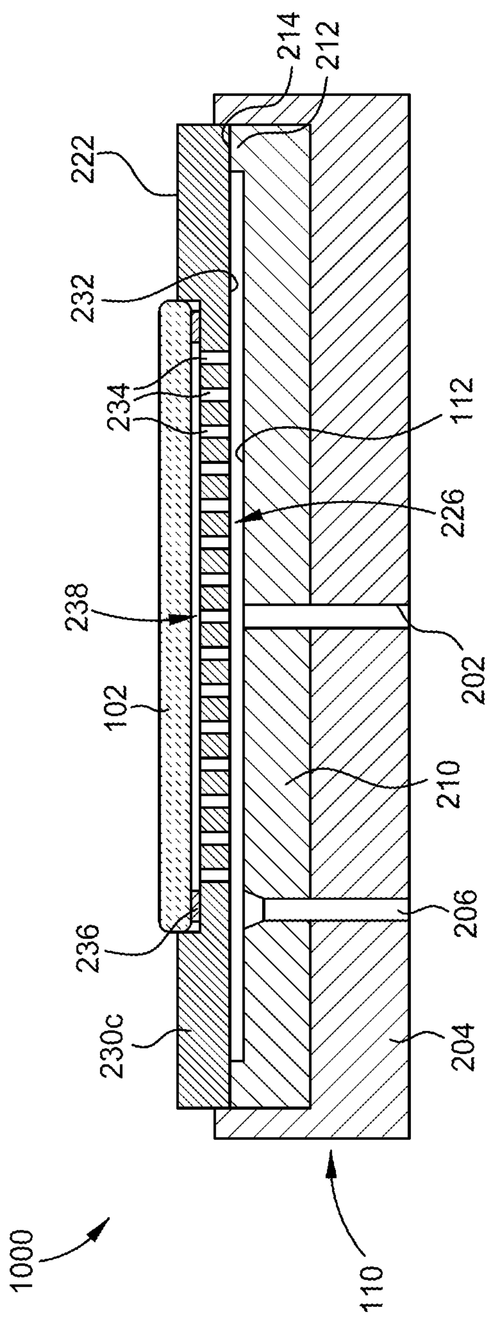
FIG. 10 is a schematic cross sectional view of another carrier positioned on a substrate support, according to another embodiment described herein.

FIG. 10 is a schematic cross sectional view of another substrate carrier 1000 positioned on a substrate support 110. The substrate carrier 1000 is configured to be a vacuum chucking substrate carrier and does not include a clamp ring, such as any of the clamp ring 240*a*, 240*b*, or the chamber clamp ring 902. The substrate carrier 1000 of FIG. 10 is able to be utilized during chemical vapor deposition (CVD) operations. A vacuum is configured to be applied to the first backside gas plenum 226 and the second backside gas plenum 238 through the backside gas passage 202 and the plurality of gas channels 234. In the embodiments which utilize the carrier 1000, the pressure above the substrate 102 is greater than the pressure below the substrate 102 and the substrate carrier 1000 within the first backside gas plenum 226 and the second backside gas plenum 238. In some embodiments, the pressure above the substrate 102 is over 1 Torr greater than the pressure below the substrate 102. The pressure above the substrate is about 4 Torr to about 6 Torr, such as about 4.5 Torr to about 5.5 Torr, such as about 5 Torr. The pressure below the substrate is about 2 Torr to about 4 Torr, such as about 2.5 Torr to about 3.5 Torr, such as about 3 Torr.

Figure 11B:
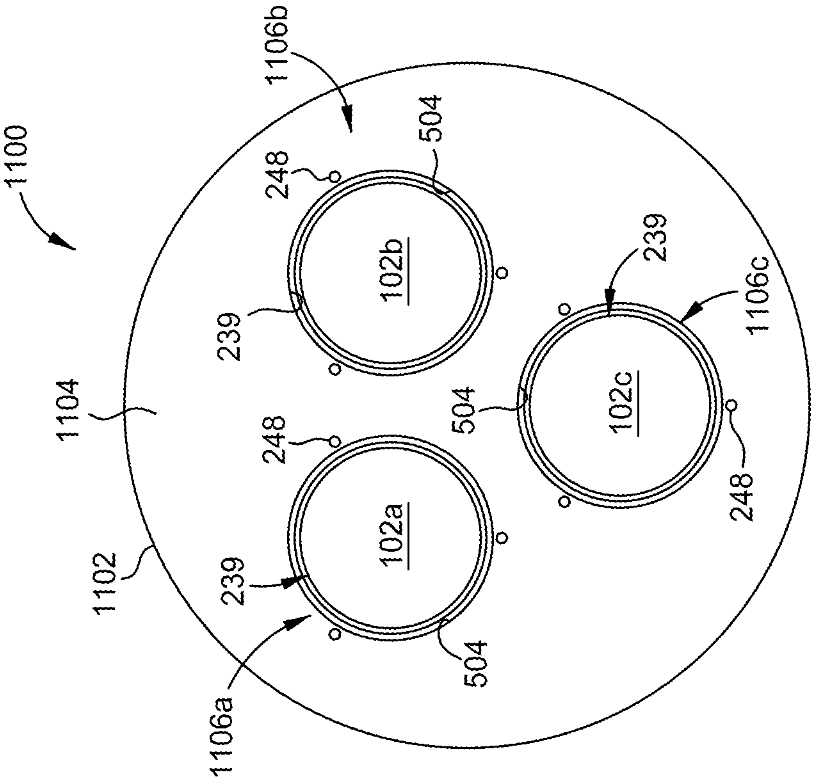
FIGS. 11A-11C are schematic plan views of a carrier with multiple substrate pockets during various stages of assembly, according to embodiments described herein.
Figure 11A:
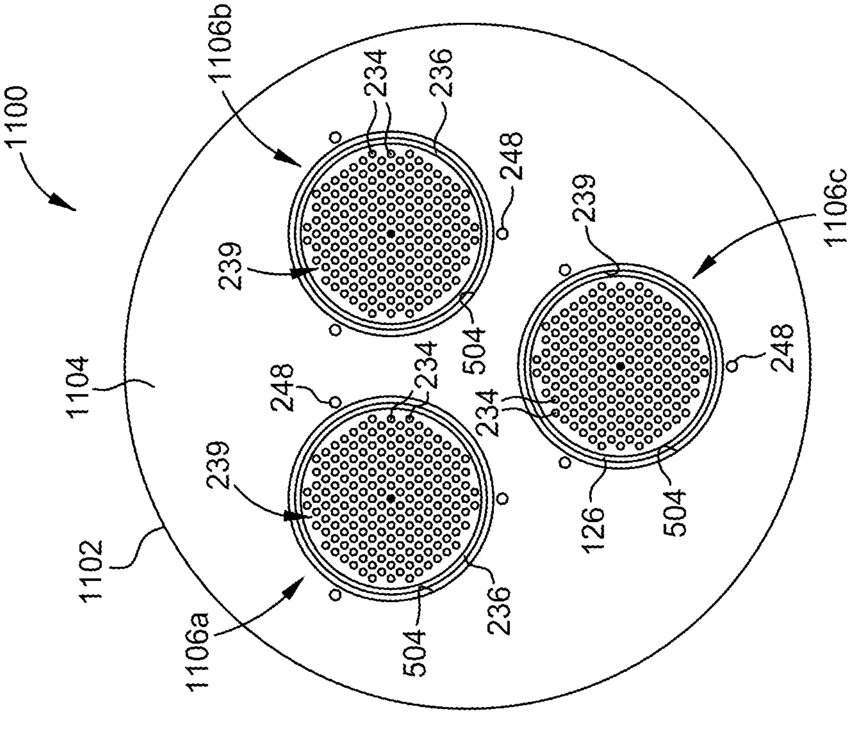
Figure 11C:
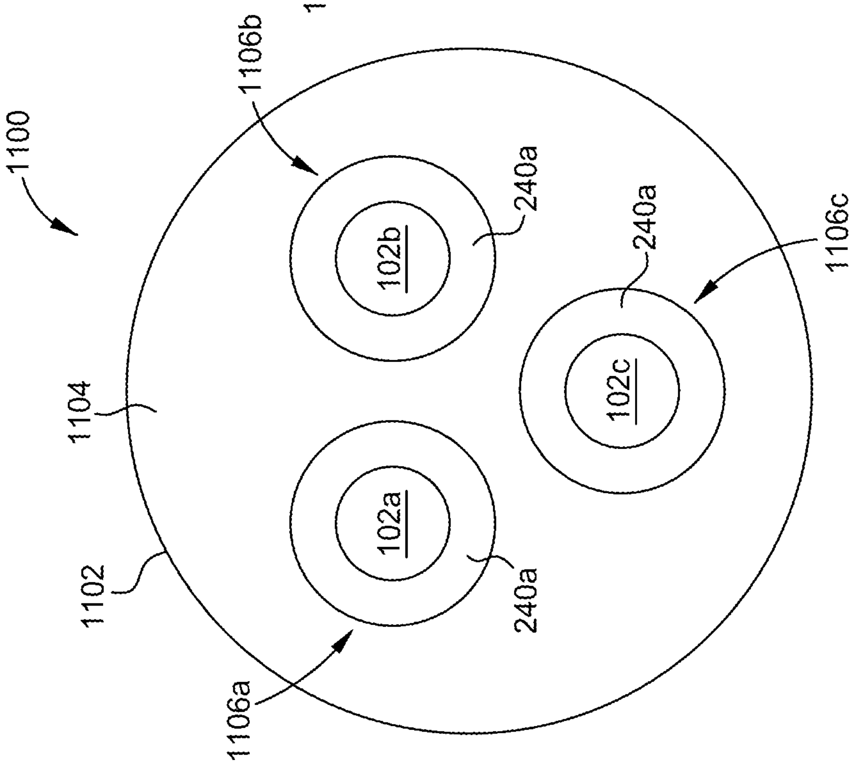

FIGS. 11A-11C are schematic plan views of a carrier 1100 with multiple substrate pockets 239 during various stages of assembly. The carrier 1100 includes a multi-pocket carrier base 1102. The multi-pocket carrier base 1102 includes a top surface 1104 with a plurality of substrate support regions 1106*a*, 1106*b*, 1106*c*. Each of the substrate support regions 1106*a*, 1106*b*, 1106*c* include a multiple substrate pocket 239. The substrate support regions 1106*a*, 1106*b*, 1106*c* include base alignment features 248 disposed around the cylindrical sidewalls 504. The substrate pockets 239 each include the plurality of gas channels 234 formed through a bottom surface thereof. Each substrate pocket 239 further includes one or more substrate support features 236.

In the embodiment of FIG. 11A, there are three substrate support regions 1106*a*, 1106*b*, 1106*c*, each with a substrate pocket 239. Therefore, there is at least a first substrate support region 1106*a*, a second substrate support region

1106*b*, and a third substrate support region 1106*c*. In some embodiments there may be two substrate support regions 1106*a*, 1106*b* or more than three substrate support regions 1106*a*, 1106*b*, 1106*c*.

FIG. 11B includes the multi-pocket carrier base 1102 after a plurality of substrates 102*a*, 102*b*, 102*c* have been placed within the substrate pockets 239 of the substrate support regions 1106*a*, 1106*b*, 1106*c*. After placing the substrates 102*a*, 102*b*, 102*c* within the substrate pockets 239, one or more clamp rings 240*a* are placed around each substrate pocket 239 as shown in FIG. 11C. Therefore, a first clamp ring 240*a* is positioned on top of the multi-pocket carrier base 1102 over the first substrate support region 1106*a*. A second clamp ring 240*a* is positioned on top of the second substrate support region 1106*b*. A third clamp ring 240*a* is positioned on top of the third substrate support region 1106*c*.

Figure 12:
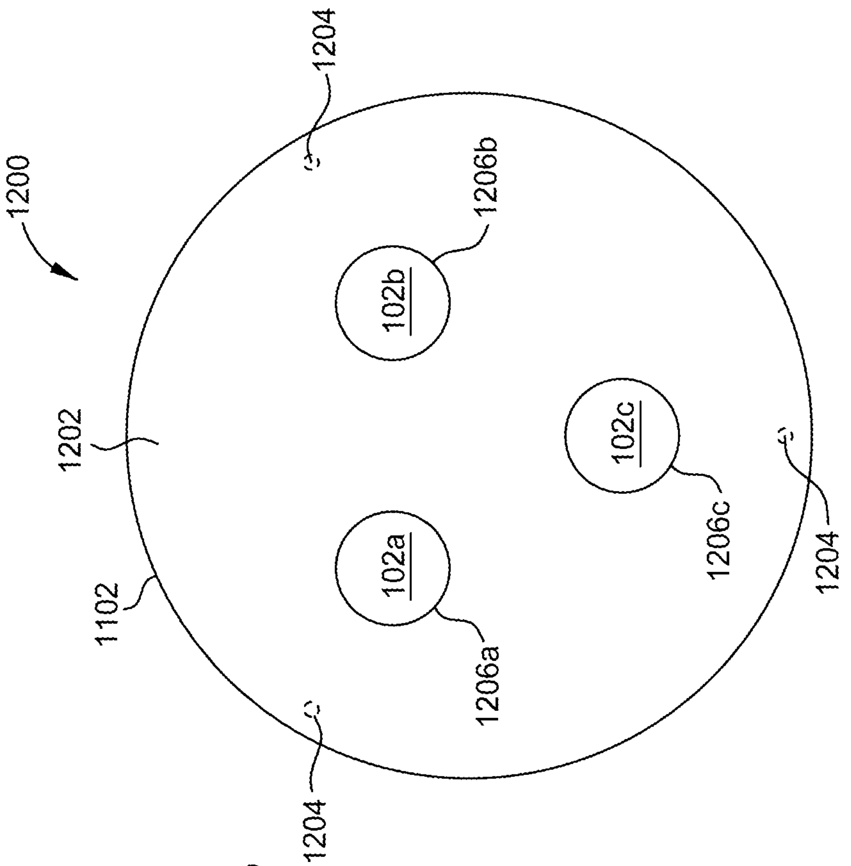
FIG. 12 is a schematic plan view of another carrier with multiple substrate pockets and a unitary clamp ring, according to embodiments described herein.

FIG. 12 is a schematic plan view of another carrier 1200 with multiple substrate pockets 239 and a unitary clamp ring 1202. The unitary clamp ring 1202 is a single cover configured to be positioned over the multi-pocket carrier base 1102. The unitary clamp ring 1202 includes a plurality of openings 1206*a* to expose top surfaces of a plurality of substrates 102*a*, 102*b*, 102*c*. Therefore, a first opening 1206*a* is positioned over a first substrate 102*a*, a second opening 1206*b* is positioned over a second substrate 102*b*, and a third opening 1206*c* is positioned over a third substrate 102*c*. The use of a unitary clamp ring 1202 enables the easier assembly as only two components are assembled. However, the unitary clamp ring 1202 is more difficult to manufacture and maintain than utilizing a plurality of clamp rings 240*a*.

The unitary clamp ring 1202 is secured to the top surface 1104 of the multi-pocket carrier base 1102 using a plurality of alignment features 1204. The alignment features 1204 may be similar to the clamp ring alignment features 246 or the openings 310.

While the foregoing is directed to embodiments of the present disclosure, other and further embodiments of the disclosure may be devised without departing from the basic scope thereof, and the scope thereof is determined by the claims that follow.

What is claimed is:

1. A carrier for holding a substrate, suitable for use in semiconductor manufacturing, comprising:

a carrier base, the carrier base comprising:

an outer base surface;

a lower base surface disposed radially inward of the outer base surface;

an upper base surface disposed radially inward of the outer base surface and opposite the lower base surface;

a substrate pocket disposed from the upper base surface and towards the lower base surface;

a plurality of gas channels formed between the lower base surface and the substrate pocket; and one or more base alignment features formed on the upper base surface, the one or more base alignment features comprising at least one opening extending inward from the upper base surface or at least one protrusion extending outward from the upper base surface; and a clamp ring disposed on the upper base surface, comprising:

an outer clamp surface;

a lower clamp surface disposed radially inward of the outer clamp surface;

an upper clamp surface disposed radially inward of the outer clamp surface and opposite the lower clamp surface;

an inner clamp surface radially inward of the outer clamp surface and connecting the lower clamp surface and the upper clamp surface, the inner clamp surface extending radially inward over the substrate pocket; and one or more clamp ring alignment features on the lower clamp surface and integrally formed with the clamp ring, the one or more clamp ring alignment features comprising protrusions or openings configured to engage the one or more corresponding base alignment features to align the clamp ring with the carrier base and inhibit relative rotation therebetween.

2. The carrier of claim 1, wherein the one or more base alignment features are the at least one protrusion extending outward from the upper base surface.

3. The carrier of claim 1, wherein the one or more base alignment features are the at least one opening extending inward from the upper base surface.

4. The carrier of claim 1, wherein the one or more clamp ring alignment features comprise the protrusions and the protrusions extend from the lower clamp surface or the openings and the openings extend into the clamp ring from the lower clamp surface, the clamp ring alignment features sized and shaped to interlock with the one or more base alignment features.

5. The carrier of claim 1, further comprising:

one or more substrate support features comprising an annular substrate support ring extending upward from a bottom surface of the substrate pocket toward the upper base surface, the annular substrate support ring configured to support the substrate and form a backside gas plenum.

6. The carrier of claim 1, wherein the clamp ring has a mass of greater than about 3.5 kg.

7. The carrier of claim 1, wherein the plurality of gas channels comprises over 100 gas channels fluidly connecting the lower base surface and the substrate pocket.

8. The carrier of claim 1, wherein a diameter of each of the gas channels of the plurality of gas channels is about 10 mils to about 75 mils.

9. The carrier of claim 1, wherein the substrate pocket has a pocket diameter of about 150 mm to about 165 mm.

10. The carrier of claim 1, wherein the substrate pocket has a pocket diameter of about 200 mm to about 220 mm.

11. A carrier for holding a substrate, suitable for use in semiconductor manufacturing, comprising:

a carrier base, the carrier base comprising:

an outer base surface;

a lower base surface;

an upper base surface opposite the lower base surface;

a substrate pocket disposed from the upper base surface and towards the lower base surface;

one or more substrate support features comprising an annular substrate support ring extending upward from a bottom surface of the substrate pocket toward the upper base surface;

a plurality of gas channels formed between the lower base surface and the substrate pocket; and one or more base alignment features formed on the upper base surface, the one or more base alignment features comprising at least one opening extending inward from the upper base surface or at least one protrusion extending outward from the upper base surface; and a clamp ring disposed on the upper base surface, comprising:

an outer clamp surface extending in line with or radially outward from the outer base surface;

a lower clamp surface;

an upper clamp surface opposite the lower clamp surface;

an inner clamp surface radially inward of the outer clamp surface and extending radially inward over the substrate pocket; and one or more clamp ring alignment features on the lower clamp surface, the one or more clamp ring alignment features comprising protrusions extending from the lower clamp surface or openings extending into the clamp ring from the lower clamp ring surface, the one or more clamp ring alignment features comprising protrusions or openings integrally formed with the clamp ring and configured to engage the one or more corresponding base alignment features to align the clamp ring with the carrier base and inhibit relative motion therebetween.

12. The carrier of claim 11, wherein the plurality of gas channels comprises over 100 gas channels fluidly connecting the lower base surface and the substrate pocket.

13. The carrier of claim 12, wherein a diameter of each of the gas channels of the plurality of gas channels is about 10 mils to about 75 mils.

14. The carrier of claim 11, wherein the outer base surface has an outer base diameter of about 300 mm to about 325 mm and the outer clamp surface has an outer clamp diameter of about 300 mm to about 325 mm.

15. The carrier of claim 11, wherein the one or more substrate support features are formed radially outward of the plurality of gas channels.

16. The carrier of claim 15, wherein the one or more substrate support features comprise a substrate support ring centered about a central axis of the carrier.

17. The carrier of claim 11, wherein the carrier base includes a carrier alignment feature comprising an alignment notch formed on at least one of the upper base surface or the outer base surface, the carrier alignment feature positioned radially outward of the one or more base alignment features.

18. A carrier for holding a substrate, suitable for use in semiconductor manufacturing, comprising:

a carrier base, the carrier base comprising:

an outer base surface having a diameter of about 300 mm to about 325 mm;

a lower base surface radially inward of the outer base surface;

an upper base surface opposite the lower base surface and radially inward of the outer base surface;

a substrate pocket disposed from the upper base surface and towards the lower base surface;

a substrate support ring extending from the substrate pocket;

a plurality of gas channels formed between the lower base surface and the substrate pocket and disposed radially inward of the substrate support ring, the plurality of gas channels comprises over 100 gas channels with each gas channel having a diameter of about 10 mils to about 75 mils;

one or more base alignment features formed on formed on the upper base surface, the one or more base alignment features comprising at least one opening extending inward from the upper base surface or at least one protrusion extending outward from the upper base surface; and a clamp ring disposed on the upper base surface, the clamp ring comprising a lower clamp surface and one or more clamp ring alignment features integrally formed with the clamp ring on the lower clamp surface, the one or more clamp ring alignment features configured to engage the one or more base alignment features to align the clamp ring with the carrier base and inhibit relative rotation therebetween.

19. The carrier of claim 18, wherein a carrier alignment notch is formed on one of the outer base surface or the lower base surface.

20. The carrier of claim 18, wherein the substrate support ring has a support width of about 1 mm to about 3 mm.

* * * * *